US012772596B2

(12) United States Patent
Park

(10) Patent No.: US 12,772,596 B2
(45) Date of Patent: Oct. 20, 2026

(54) SEMICONDUCTOR DEVICE HAVING STACKED STRUCTURE AND METHOD FOR MANUFACTURING THE SAME

(71) Applicant: SK hynix Inc., Icheon-si (KR)

(72) Inventor: Won Je Park, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 437 days.

(21) Appl. No.: 18/468,551

(22) Filed: Sep. 15, 2023

(65) Prior Publication Data

US 2024/0096921 A1 Mar. 21, 2024

(30) Foreign Application Priority Data

Sep. 16, 2022 (KR) ........................ 10-2022-0117474
Jun. 22, 2023 (KR) ........................ 10-2023-0080647

(51) Int. Cl.
*H10F 39/00* (2025.01)

(52) U.S. Cl.
CPC ......... *H10F 39/811* (2025.01); *H10F 39/018* (2025.01); *H10F 39/809* (2025.01)

(58) Field of Classification Search
CPC ..... H10F 39/811; H10F 39/018; H10F 39/809
See application file for complete search history.

(56) References Cited

U.S. PATENT DOCUMENTS 11,164,749 B1 * 11/2021 Chong .................... H10P 50/00
2014/0094030 A1 * 4/2014 Shimotsusa ........... H10W 20/01 438/652
2020/0127032 A1 * 4/2020 Ogino ................... H10F 39/026
2020/0343280 A1 * 10/2020 Ishino .................. H10F 39/807
2023/0083783 A1 * 3/2023 Yang ..................... H10F 39/809 257/107
2023/0187465 A1 * 6/2023 Hsueh ................. H10F 39/8053 257/432
2023/0187466 A1 * 6/2023 Hara ..................... H10F 39/807 257/444

FOREIGN PATENT DOCUMENTS

KR 20190048490 A 5/2019
KR 20190131485 A 11/2019

* cited by examiner

*Primary Examiner* — Steven M Page
(74) *Attorney, Agent, or Firm* — Ashurst Perkins Coie US LLP

(57) ABSTRACT

A semiconductor device includes a first stacked structure including a first substrate having unit pixels, and a first interconnect layer having first conductive lines connected to the unit pixels; a second stacked structure including a second substrate having first circuit elements configured to operate the unit pixels and a second interconnect layer having second conductive lines connected to the first circuit elements and an electrode pad, and a first interconnection via structure penetrating the second substrate; a third stacked structure including a third substrate having second circuit elements configured to process signals received from the second stacked structure, and a third interconnect layer having third conductive lines connected to the second circuit elements; and a pad open region disposed outside of a pixel region including the unit pixels and exposing a top surface of the electrode pad to outside.

6 Claims, 12 Drawing Sheets

SEMICONDUCTOR DEVICE HAVING STACKED STRUCTURE AND METHOD FOR MANUFACTURING THE SAME

CROSS-REFERENCE TO RELATED APPLICATION

This patent document claims the priority and benefits of Korean patent application Nos. 10-2022-0117474 filed on 16 Sep. 2022 and 10-2023-0080647 filed on 22 Jun. 2023, which are incorporated by reference in its entirety as part of the disclosure of this patent document.

TECHNICAL FIELD

The technology and implementations disclosed in this patent document generally relate to a semiconductor device including a stacked structure.

BACKGROUND

With the recent development of automotive, medical, computer and communication industries, the demand for highly integrated, higher-performance image sensors has been rapidly increasing in various electronic devices such as digital cameras, camcorders, personal communication systems (PCSs), video game consoles, surveillance cameras, medical micro-cameras, robots, etc.

SUMMARY

Various embodiments of the disclosed technology relate to a semiconductor device with multiple layers capable of reducing a chip size while performing various functions.

In accordance with an embodiment of the disclosed technology, a semiconductor device may include a first stacked structure configured to include a first substrate having unit pixels configured to generate pixel signals through conversion of incident light, and a first interconnect layer having first conductive lines connected to the unit pixels; a second stacked structure configured to include a second substrate having first circuit elements configured to operate the unit pixel to read out the pixel signals generated from the unit pixels, the second stacked structure further including a second interconnect layer having second conductive lines connected to the first circuit elements and an electrode pad, and a first interconnection via structure formed to penetrate the second substrate; a third stacked structure configured to include a third substrate having second circuit elements configured to process signals received from the second stacked structure, and a third interconnect layer having third conductive lines connected to the second circuit elements; and a pad open region disposed outside of a pixel region including the unit pixels and exposing a top surface of the electrode pad to outside. The first stacked structure is disposed over the second stacked structure such that the first interconnect layer and the second interconnect layer are bonded to each other, the second stacked structure is disposed over the third stacked structure such that the second interconnection layer is disposed apart from the third interconnect layer, and a first surface of the first interconnection via structure is in contact with a bottom surface of the electrode pad and a second surface opposite to the first surface is bonded to the third interconnect layer.

In accordance with another embodiment of the disclosed technology, a semiconductor device may include a first substrate configured to include a first front surface and a first back surface facing or opposite to the first front surface; a second substrate disposed apart from and stacked over the first substrate and configured to include a second front surface and a second back surface facing or opposite to the second front surface; a third substrate disposed apart from and stacked over the second substrate and configured to include a third front surface and a third back surface facing or opposite to the third front surface; a first interconnect layer disposed over the first front surface and between the first substrate and the second substrate, the first interconnection layer configured to include a first conductive lines; a second interconnect layer disposed between the second front surface and the first interconnect layer and configured to include an electrode pad and second conductive lines; a third interconnect layer disposed between the second back surface and the third front surface and configured to include a third conductive lines; a first interconnection via structure formed to penetrate the second substrate and configured to connect the electrode pad to the third conductive lines; and a second interconnection via structure formed to penetrate the second substrate and configured to connect the second conductive lines to the third conductive lines.

In accordance with another embodiment of the disclosed technology, a method for manufacturing a semiconductor device may include: forming a first stacked structure in which a first interconnect layer having a first bonding pad is formed over a first front surface of a first substrate, a second stacked structure in which a second interconnect layer having a second bonding pad and an electrode pad is formed over a second front surface of a second substrate, and a third stacked structure in which a third interconnect layer having a third bonding pad is formed over a third front surface of a third substrate; disposing the first stacked structure over the second stacked structure such that the first bonding pad and the second bonding pad are directly bonded to each other; forming an interconnection via structure that penetrates the second substrate and contacts the electrode pad by etching the second substrate and the second interconnect layer; and disposing the third stacked structure over the second stacked structure such that the interconnection via structure and the third bonding pad are directly bonded to each other.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Figure 1:
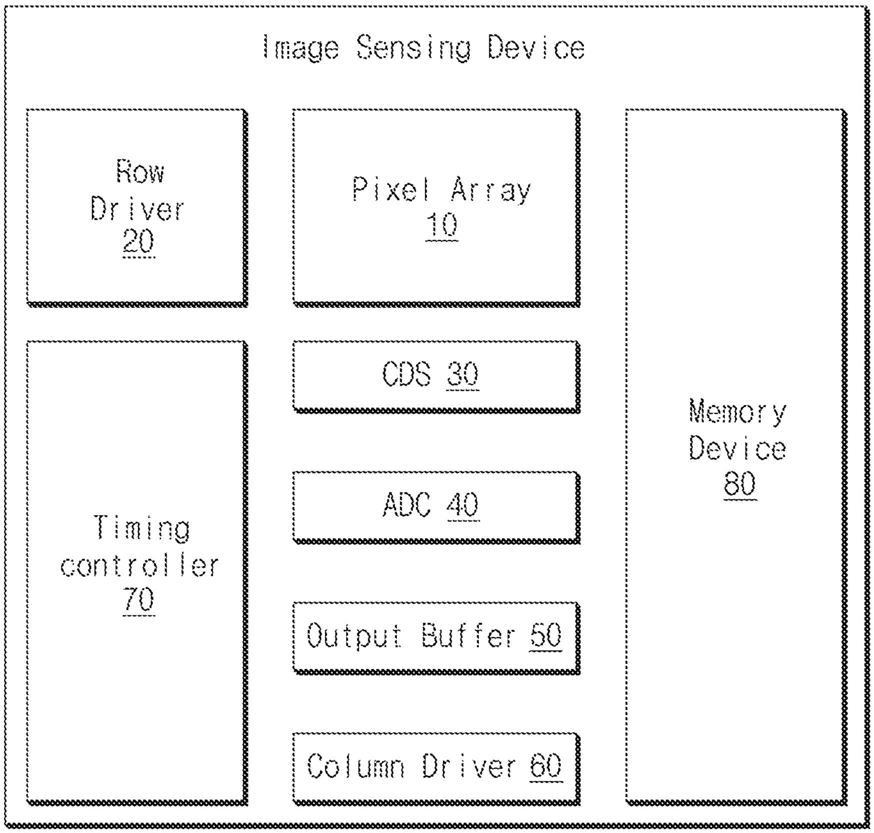
FIG. 1 is a block diagram illustrating an example of an image sensing device based on some implementations of the disclosed technology.

This patent document provides implementations and examples of a semiconductor device including a stacked structure that may be used to substantially address one or more technical or engineering issues and mitigate limitations or disadvantages encountered in some other semiconductor devices. Some implementations of the disclosed technology suggest examples of a semiconductor device capable of reducing a chip size while performing various functions. The disclosed technology provides various implementations of a semiconductor device which can reduce the chip size while performing various functions by stacking substrate layers designed to perform different functions.

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

Hereafter, various embodiments will be described with reference to the accompanying drawings. However, it should be understood that the disclosed technology is not limited to specific embodiments, but includes various modifications, equivalents and/or alternatives of the embodiments. The embodiments of the disclosed technology may provide a variety of effects capable of being directly or indirectly recognized through the disclosed technology.

The stacked structures for semiconductor devices disclosed in this patent document enable different stacked substrates to be structured to support different circuit modules or functions on the respective different substrates while using substrate-to-substrate interconnection vias to electrically connect the different circuit modules on the different substrates and interconnection layers between two adjacent stacked substrate to provide desired electrical connections for such a stacked semiconductor device to operate and to perform desired functions. For example, a semiconductor device based on the disclosed technology may include a first substrate configured to include a first front surface and a first back surface facing or opposite to the first front surface; a second substrate disposed apart from and stacked over the first substrate and configured to include a second front surface and a second back surface facing or opposite to the second front surface; and a third substrate disposed apart from and stacked over the second substrate and configured to include a third front surface and a third back surface facing or opposite to the third front surface. In addition, this device may further include a first interconnect layer disposed over the first front surface and between the first substrate and the second substrate, the first interconnect layer configured to include a first conductive line; a second interconnect layer disposed between the second front surface and the first interconnect layer and configured to include an electrode pad and a second conductive line; and a third interconnect layer disposed between the second back surface and the third front surface and configured to include a third conductive line. Furthermore, this device may include a first interconnection via structure formed to penetrate the second substrate and configured to connect the electrode pad to the third conductive line; and a second interconnection via structure formed to penetrate the second substrate and configured to connect the second conductive line to the third conductive line.

Such semiconductor devices with stacked structures may be structured to include various circuits on the different stacked substrates for desired device functions and operations including image sensor devices and other devices that are not image sensor devices. The specific examples disclosed below use image sensor devices to illustrate various features of the disclosed stacked structures and interconnections and the disclosed stacked structures and interconnections can be used beyond image sensor devices.

An image sensor is used in electronic devices to convert optical images into electrical signals. To achieve desired high imaging resolutions and high-speed operations, image sensors may be designed to use disclosed stacked structures and interconnections to separate different parts into circuits on different stacked substrates to connect circuits in the upper layers stacked on lower layers by through silicon via (TSV) structures that electrically connect circuits of the upper and lower layers to each other.

FIG. 1 is a block diagram illustrating an image sensing device based on some implementations of stacked structures and interconnections of the disclosed technology.

Referring to FIG. 1, the image sensing device may include a pixel array 10, a row driver 20, a correlated double sampler (CDS) 30, an analog-digital converter (ADC) 40, an output buffer 50, a column driver 60, a timing controller 70, and a memory device 80. The components of the image sensing device illustrated in FIG. 1 are discussed by way of example only, and this patent document encompasses numerous other changes, substitutions, variations, alterations, and modifications. In this patent document, the word "pixel" can be used to indicate an image sensing pixel that is structured to detect incident light to generate electrical signals carrying images in the incident light, and a phase detection pixel that is structured to generate second electrical signals for calculating a phase difference between the images.

The pixel array 10 may include a plurality of unit pixels arranged in rows and columns. In one example, the plurality of unit pixels can be arranged in a two dimensional (2D) pixel array including rows and columns. In another example, the plurality of unit pixels can be arranged in a three dimensional (3D) pixel array. The plurality of unit pixels may convert an optical signal into an electrical signal on a unit pixel basis or a pixel group basis, where unit pixels in a pixel group share at least certain internal circuitry (e.g., a floating diffusion region, and a pixel transistor). Each of the image pixels may generate an image signal acting as an electrical signal corresponding to a target object to be captured.

The pixel array 10 may receive driving signals (for example, a row selection signal, a reset signal, a transmission (or transfer) signal, etc.) from the row driver 20. Upon receiving the driving signal, the unit pixels may be activated to perform the operations corresponding to the row selection signal, the reset signal, and the transfer signal.

The row driver 20 may activate the pixel array 10 to perform certain operations on the unit pixels in the corresponding row based on control signals provided by controller circuitry such as the timing controller 70. In some implementations, the row driver 20 may select one or more pixel groups arranged in one or more rows of the pixel array 10. The row driver 20 may generate a row selection signal to select one or more rows from the plurality of rows. The row driver 20 may sequentially enable the reset signal and the transfer signal for the unit pixels arranged in the selected row. The pixel signals generated by the unit pixels arranged in the selected row may be output to the correlated double sampler (CDS) 30.

The correlated double sampler (CDS) 30 may remove undesired offset values of the unit pixels using correlated double sampling. In one example, the correlated double sampler (CDS) 30 may remove the undesired offset values of the unit pixels by comparing output voltages of pixel signals (of the unit pixels) obtained before and after photocharges generated by incident light are accumulated in the sensing node (i.e., a floating diffusion (FD) node). As a result, the CDS 30 may obtain a pixel signal generated only by the incident light without causing noise. In some implementations, upon receiving a clock signal from the timing controller 70, the CDS 30 may sequentially sample and hold voltage levels of the reference signal and the pixel signal, which are provided to each of a plurality of column lines from the pixel array 10. That is, the CDS 30 may sample and hold the voltage levels of the reference signal and the pixel signal which correspond to each of the columns of the pixel array 10. In some implementations, the CDS 30 may transfer the reference signal and the pixel signal of each of the columns as a correlate double sampling (CDS) signal to the ADC 40 based on control signals from the timing controller 70.

The ADC 40 is used to convert analog CDS signals received from the CDS 30 into digital signals. In some implementations, the ADC 40 may be implemented as a ramp-compare type ADC. The analog-to-digital converter (ADC) 40 may compare a ramp signal received from the timing controller 70 with the CDS signal received from the CDS 30, and may thus output a comparison signal indicating the result of comparison between the ramp signal and the CDS signal. The analog-to-digital converter (ADC) 40 may count a level transition time of the comparison signal in response to the ramp signal received from the timing controller 70, and may output a count value indicating the counted level transition time to the output buffer 50.

The output buffer 50 may temporarily store column-based image data provided from the ADC 40 based on control signals of the timing controller 70. The image data received from the ADC 40 may be temporarily stored in the output buffer 50 based on control signals of the timing controller 70. The output buffer 50 may provide an interface to compensate for data rate differences or transmission rate differences between the image sensing device and other devices.

The column driver 60 may select a column of the output buffer 50 upon receiving a control signal from the timing controller 70, and sequentially output the image data, which are temporarily stored in the selected column of the output buffer 50. In some implementations, upon receiving an address signal from the timing controller 70, the column driver 60 may generate a column selection signal based on the address signal, may select a column of the output buffer 50 using the column selection signal, and may control the image data received from the selected column of the output buffer 50 to be output as an output signal.

The timing controller 70 may generate signals for controlling operations of the row driver 20, the ADC 40, the output buffer 50 and the column driver 60. The timing controller 70 may provide the row driver 20, the column driver 60, the ADC 40, and the output buffer 50 with a clock signal required for the operations of the respective components of the image sensing device, a control signal for timing control, and address signals for selecting a row or column. In some implementations, the timing controller 70 may include a logic control circuit, a phase lock loop (PLL) circuit, a timing control circuit, a communication interface circuit and others.

The memory device 80 may include memory circuits for storing pixel signals output from the output buffer 50.

In some implementations, the different circuits or modules in the image sensing device illustrated in FIG. 1 may be all formed over or supported by a common silicon substrate. Such a design may limit the size of the pixel array 10 and thus the spatial imaging resolution of the imaging device. The disclosed stacked structures and interconnections in this patent document can be used to construct image sensors by separating different parts of an imaging device into circuits on different stacked substrates to allow for a large pixel array 10 with a large number of imaging pixels and/or implementing larger size imaging pixels for the improved imaging resolution or imaging quality.

Figure 2:
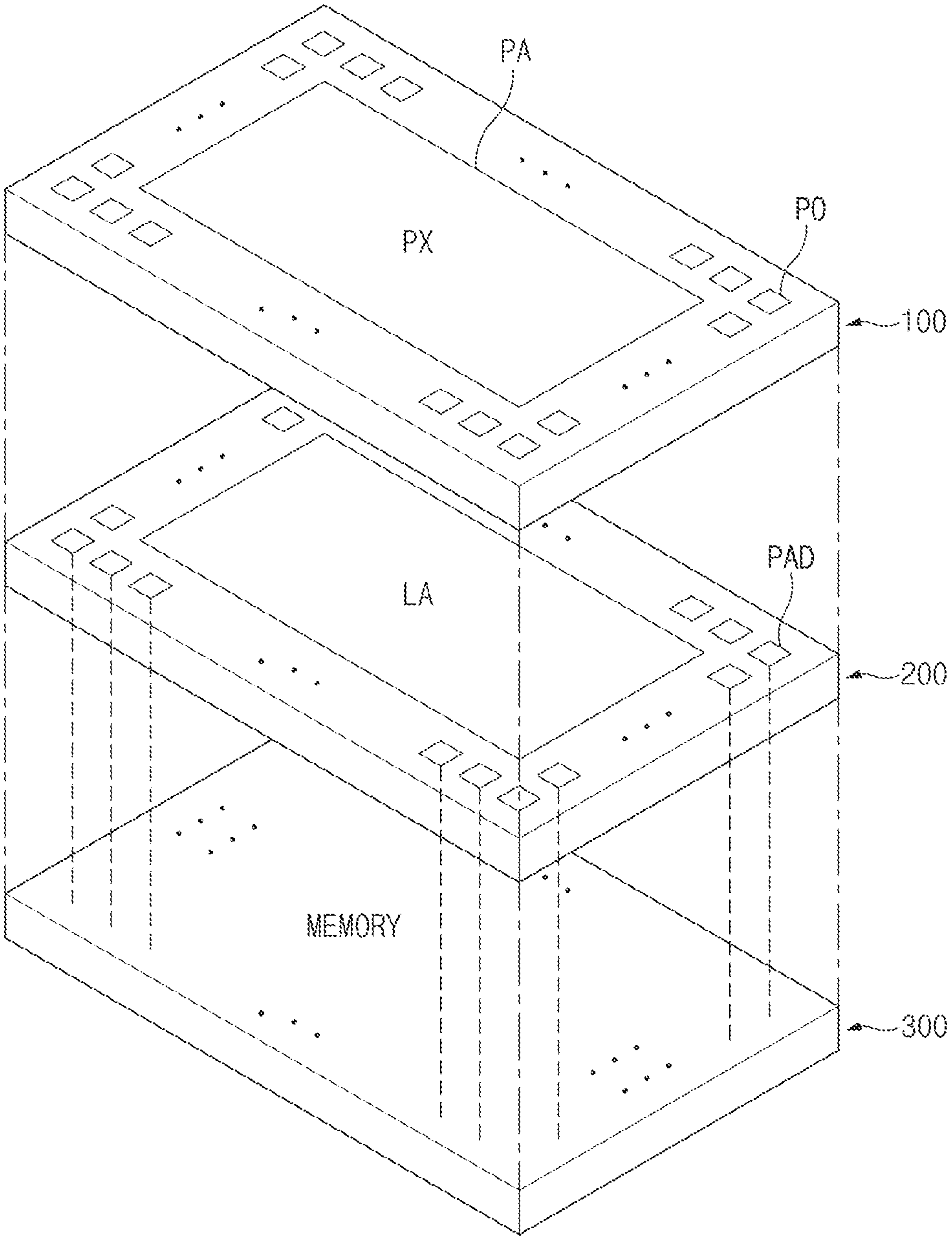
FIG. 2 is a perspective view schematically illustrating an example structure of an image sensing device based on some implementations of the disclosed technology.
Figure 3:
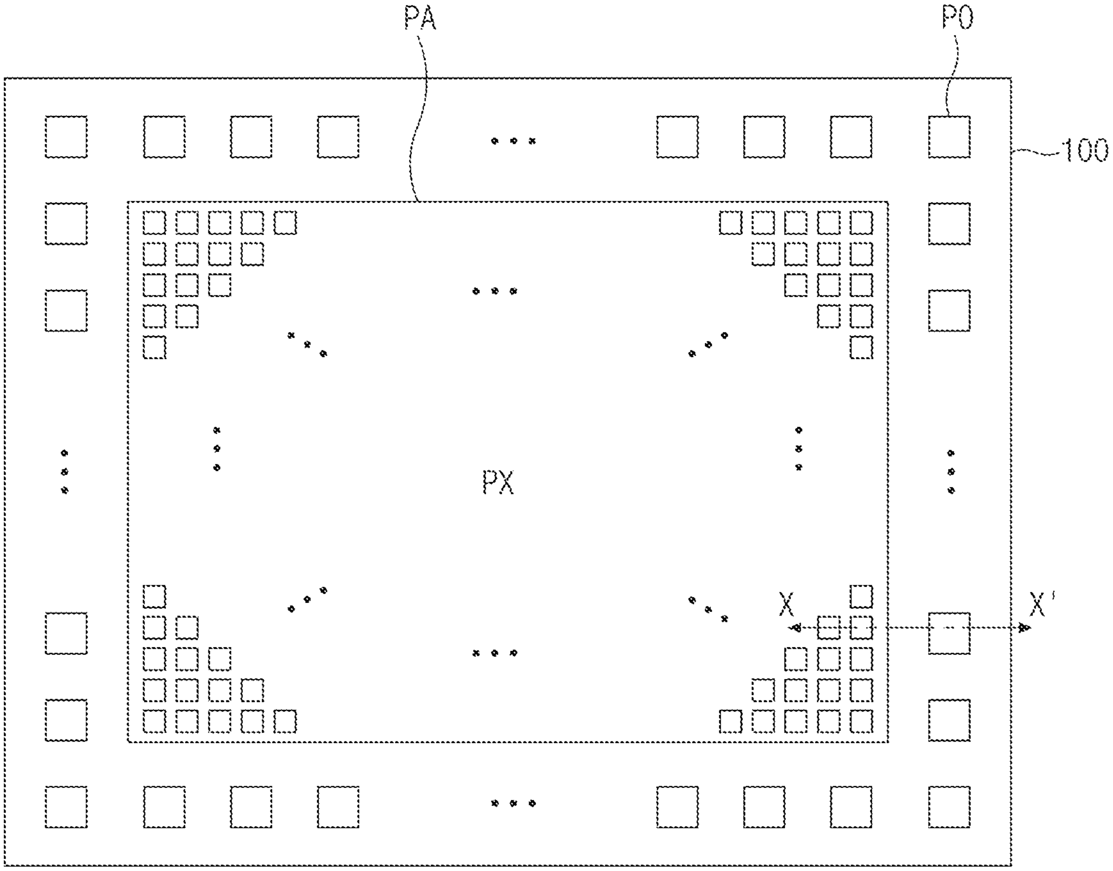
FIG. 3 is a plan view illustrating an example of a planar arrangement structure of the image sensing device shown in FIG. 2 based on some implementations of the disclosed technology.

FIG. 2 is a perspective view schematically illustrating an example structure of the image sensing device based on some implementations of a stacked structure using different substrates based on the disclosed technology. FIG. 3 is a plan view illustrating an example of a planar arrangement structure of the image sensing device shown in FIG. 2 based on some implementations of the disclosed technology.

Referring to FIGS. 2 and 3, the image sensing device based on some implementations of the disclosed technology may include a structure in which a first stacked structure 100, a second stacked structure 200, and a third stacked structure 300 are stacked to support different circuits or modules of the image sensing device such as the one shown in FIG. 1.

The first stacked structure 100 may be formed over the second stacked structure 200 in a manner that the first stacked structure 100 can be electrically connected to the second stacked structure 200 while contacting the second stacked structure 200. The first stacked structure 100 may include a pixel region (PA) in which the pixel array 10 of FIG. 1 is formed, and a plurality of pad open (PO) regions located outside the pixel region (PA) to expose electrode pads (PAD) formed in the second stacked structure 200. The pixel region (PA) may be disposed at a center portion of the first stacked structure 100. The pixel region (PA) may include a plurality of unit pixels (PXs) arranged in rows and columns.

The first stacked structure 100 may include a first substrate including a first front surface and a first back surface facing or opposite to the first front surface, a first interconnect layer disposed below the first front surface of the first substrate, and a light reception layer disposed over the first back surface of the first substrate. The first substrate may include photoelectric conversion elements located to correspond to the unit pixels (PXs). Pixel transistors and floating diffusion (FD) regions may be formed over the first back surface of the first substrate. The first interconnect layer may include conductive lines for electrically connecting the first stacked structure 100 and the second stacked structure 200 to each other. The first interconnect layer may include a structure in which metal lines are formed in an insulation layer. The metal lines of the first interconnect layer may be electrically connected to the metal lines of the second stacked structure 200 through a hybrid bonding method. The hybrid bonding refers to a bonding technique for a permanent bond that combines a dielectric bond with embedded metal to form interconnections. The light reception layer may include color filters, an over-coating layer, and microlenses.

The second stacked structure 200 may include a drive circuit for driving the unit pixels (PX) in the pixel region (PA) of the first stacked structure 100 to read out electrical signals (pixel signals) generated from the unit pixels (PXs). For example, the second stacked structure 200 may include a logic region (LA) in which the row driver 20, the CDS 30, the ADC 40, the output buffer 50, the column driver 60, and the timing controller 70 shown in FIG. 1 are formed. The logic region (LA) may be disposed at a center portion of the second stacked structure 200.

The second stacked structure 200 may include a second substrate including a second front surface and a second back surface facing or opposite to the second front surface, and a second interconnect layer disposed over the second front surface of the second substrate so as to be in contact with the first interconnect layer of the first stacked structure 100. Electronic devices (e.g., logic transistors) constituting a logic circuit may be formed over the second front surface of the second substrate. The second interconnect layer may include conductive lines for electrically connecting conductive lines of the first interconnect layer and the logic circuit of the second substrate to each other. The second interconnect layer may include a structure in which metal lines are formed in an insulation layer. The metal lines of the second interconnect layer may be electrically connected to the metal lines of the first stacked structure 100 through a hybrid bonding method.

The second stacked structure 200 may include electrode pads (PAD) for connection with external devices. The electrode pads (PAD) may be or correspond to some of metal lines formed over the second interconnect layer. For example, the electrode pads (PAD) may be formed of or include pad-shaped portions of some metal lines located at the uppermost layer among metal lines formed over the second interconnect layer. The electrode pads (PAD) may be exposed outside through the pad open (PO) region of the first stacked structure 100 so that the electrode pads (PAD) can be directly connected to a wire bonding ball through a direct bonding method. The second stacked structure 200 may include through silicon via (TSV) structures formed to penetrate the second substrate. The TSV structures may electrically connect electrode pads (PAD) and metal lines of the second interconnect layer to metal lines of the third stacked structure 300. The TSV structures are examples of interconnection structures electrically connecting two or more components and other implementations are also possible.

The third stacked structure 300 may be formed under the second stacked structure 200 in a manner that the third stacked structure 300 is electrically connected to the second stacked structure 200 while contacting the second stacked structure 200. The third stacked structure 300 may include logic circuits for processing signals received from the second stacked structure 200. For example, the third stacked structure 300 may include the memory device 80 of FIG. 1. In some implementations, the third stacked structure 300 may include processors (e.g., application processors) for processing signals received from the second stacked structure 200 according to a preset logic. Hereinafter, an example case in which the third stacked structure 300 includes the memory device 80 will be described as an example.

The third stacked structure 300 may include a third substrate including a third front surface and a third back surface facing or opposite to the third front surface, and a third interconnect layer disposed over the third front surface of the third substrate. Electronic devices (e.g., memory transistors constituting a memory cell and a logic circuit) constituting a memory circuit may be formed over the third front surface of the third substrate. The third interconnect layer may include conductive lines for electrically connecting the TSV structures of the second stacked structure 200 to the memory circuit of the third substrate. The third interconnect layer may include a structure in which metal lines are formed in an insulation layer. The metal lines of the third interconnect layer may be electrically connected to the TSV structures of the second stacked structure 200 through a hybrid bonding method.

Figure 4:
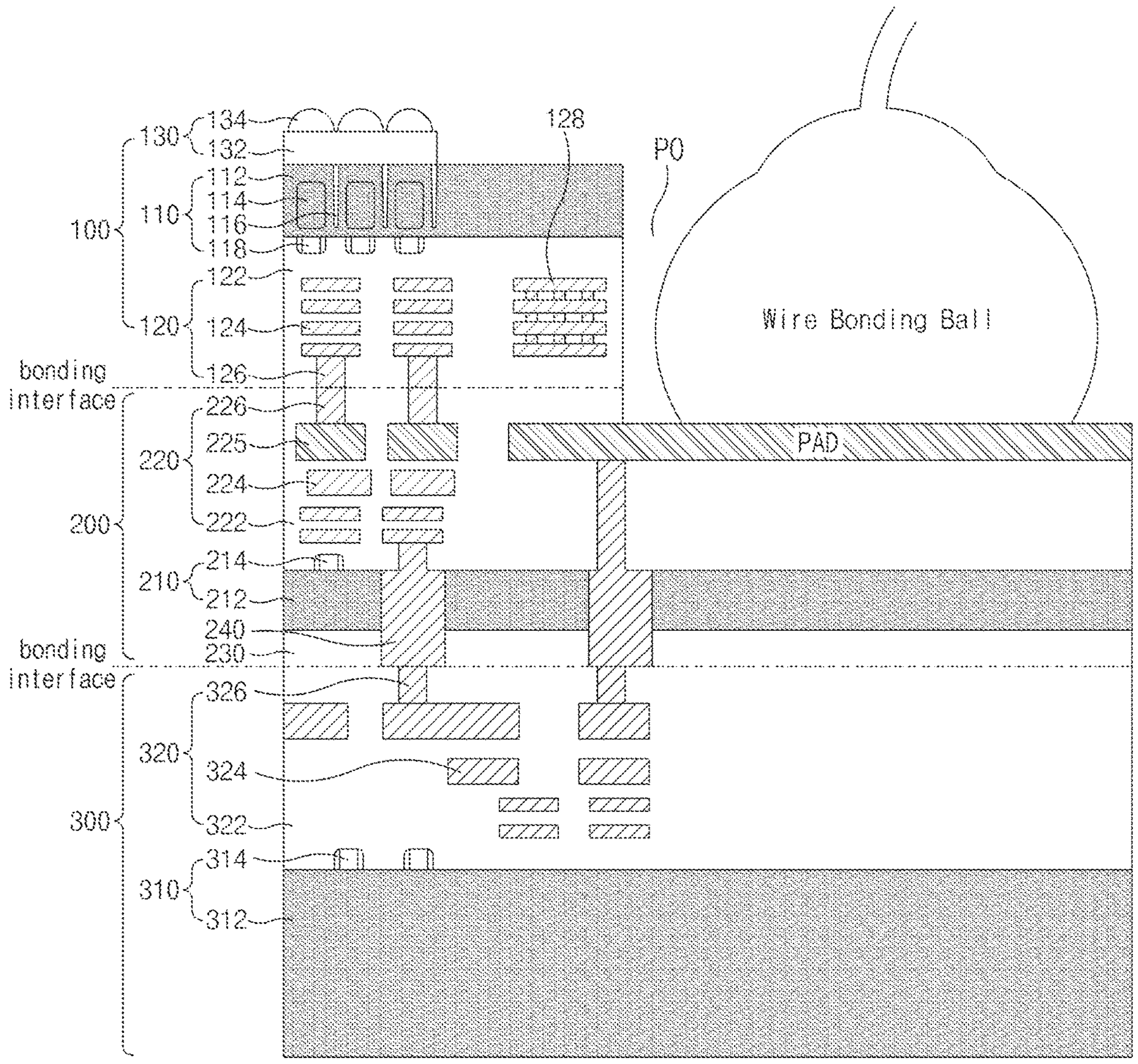
FIG. 4 is a cross-sectional view illustrating an example of the image sensing device taken along the line X-X' shown in FIG. 3 based on some implementations of the disclosed technology.

FIG. 4 is a cross-sectional view illustrating an example of the image sensing device taken along the line X-X' shown in FIG. 3 based on some implementations of the disclosed technology.

Referring to FIG. 4, the first stacked structure 100 may include a first substrate layer 110, a first interconnect layer 120 and a light reception layer 130.

The first substrate layer 110 may include a first substrate 112, a photoelectric conversion element 114, a pixel isolation structure 116, and pixel transistors 118.

The first substrate 112 may include a first front surface and a first back surface facing or opposite to the first front surface. The first back surface of the first substrate 112 may be a light reception surface upon which light is incident, and the light reception layer 130 may be formed over the first back surface. The first front surface may be formed to have the pixel transistors 118, and the first interconnect layer 120 may be formed below the first front surface. The first interconnect layer 120 may be located closer to the first front surface of the first substrate 112 as compared to the first back surface of the first substrate 112. The first substrate 112 may include a semiconductor substrate. For example, the first substrate 112 may be or include a bulk-silicon substrate or a silicon-on-insulator (SOI) substrate. Alternatively, the first substrate 112 may be formed of an epitaxial layer formed over a base substrate.

The photoelectric conversion element 114 may generate photocharges through photoelectric conversion of incident light received through the light reception layer 130. The photoelectric conversion element 114 may be formed in the first substrate 112 to correspond to the unit pixels (PXs) within the pixel region (PA). The photoelectric conversion element 114 may generate photocharges in proportion to the amount of incident light. Thus, as the amount of incident light increases, the amount of the photocharges generated by the photoelectric conversion element 114 increases. The photoelectric conversion element 114 may include a photodiode, a phototransistor, a photogate, a pinned photodiode, an organic photodiode, a quantum dot, or a combination thereof, but the disclosed technology is not limited thereto.

The pixel isolation structure 116 may isolate the photoelectric conversion elements 114 from each other within the first substrate 112. The pixel isolation structure 116 may include a trench isolation structure but other implementations are also possible.

The pixel transistors 118 may be formed over the first front surface of the first substrate 112, may be electrically connected to the first metal lines 124 of the first interconnect layer 120, and may thus operate based on the control of the logic circuit of the second stacked structure 200. The pixel transistors 118 may generate pixel signals corresponding to the photocharges generated by the photoelectric conversion element 114, and may output the pixel signals through the first metal lines 124 of the first interconnect layer 120. The pixel signal may be transferred to the logic transistors 214 not only through the first metal lines 124 and the first bonding pad 126 of the first interconnect layer 120, but also through second metal lines (224, 225) and the second bonding pad 226 of the second interconnect layer 220. Pixel transistors 118 may include a transfer transistor, a reset transistor, a source follower transistor, and a selection transistor.

The first interconnect layer 120 may be formed under the first front surface of the first substrate 112 so as to be in contact with the second interconnect layer 220 of the second stacked structure 200. The first interconnect layer 120 may include a first interlayer insulation layer 122, a plurality of first metal lines 124 formed in the first interlayer insulation layer 122, a plurality of first bonding pads 126, and a seal-ring structure 128. The plurality of first metal lines 124, the plurality of first bonding pads 126, and the seal-ring structure 128 are disposed spaced apart from the pixel transistor 118.

The first interlayer insulation layer 122 may include an insulation material formed between any two of the seal-ring structure 128, the pixel transistors 118, the first metal lines 124, and the first bonding pads 126. For example, the first interlayer insulation layer 122 may include an insulation material formed between the pixel transistors 118 and the first metal lines 124, between the pixel transistors 118 and the seal-ring structure 128, or between the first metal lines 124 and the seal-ring structure 128. The first interlayer insulation layer 122 may include at least one of silicon oxide, silicon nitride, or silicon oxynitride.

The first metal lines 124 may be formed in the first interlayer insulation layer 122, and may electrically connect the pixel transistors 118 and the first bonding pads 126 to each other. In addition, the first metal lines 124 may electrically interconnect the pixel transistors 118 in the pixel region (PA). The first metal lines 124 may include copper (Cu), and may be formed in a multilayer structure. In some implementations, the first metal lines 124 may include metal lines formed to extend in a horizontal direction, and vias (not shown) through which metal lines disposed in different layers are vertically connected to each other.

The first bonding pads 126 may electrically connect the first metal lines 124 to the second interconnect layer 220 of the second stacked structure 200. Top surfaces of the first bonding pads 126 may be connected to the first metal lines 124, and bottom surfaces of the first bonding pads 126 may be formed at the same level as a bottom surface of the first interlayer insulation layer 122. Bottom surfaces of the first bonding pads 126 may be bonded to top surfaces of the second bonding pads 226 formed in the second interconnect layer 220 of the second stacked structure 200. In some implementations, the first stacked structure 100 and the second stacked structure 200 may be bonded by a hybrid bonding method in which bonding pads (126, 226) are directly bonded to each other at a bonding interface and the interlayer insulation layers (122, 222) are directly bonded to each other at the bonding interface. The first bonding pads 126 may include copper (Cu).

The seal-ring structure 128 may be formed on the side of the pad open (PO) region and to surround the pad open (PO) region, such that the seal-ring structure 128 can prevent moisture from penetrating into the pixel region (PA) through the first interlayer insulation layer 122 or can prevent cracks from propagating toward the pixel region (PA). The seal-ring structure 128 may include multilayer metal lines and vias disposed between the multilayer metal lines.

The light reception layer 130 may include color filters 132 formed over the first back surface of the first substrate 112, and microlenses 134 formed over the color filters 132.

The color filters 132 may be arranged to correspond to the unit pixels (PXs), and may filter visible light from incident light. The color filters 132 may include red, green, or blue color filters (R, G, B) arranged in a Bayer pattern.

The microlenses 134 may be formed over the color filters 132. Each of the microlenses 134 may be formed in a convex shape having a predetermined radius of curvature (RoC) to converge incident light onto the photoelectric conversion element 114 of the corresponding unit pixel (PX).

The second stacked structure 200 may include a second substrate layer 210, a second interconnect layer 220, a bonding insulation layer 230 and a through silicon via (TSV) structure 240.

The second substrate layer 210 may include a second substrate 212 and a plurality of logic transistors 214.

The second substrate 212 may include a second front surface and a second back surface facing or opposite to the second front surface. The second front surface of the second substrate 212 may be in contact with the second interconnect layer 220, and the logic transistors 214 may be formed on the second front surface of the second substrate 212. The second substrate 212 may be formed of or include the same material as the first substrate 112.

The logic transistors 214 may be formed over the second front surface of the second substrate 212 to be connected to the second metal lines 224. The logic transistors 214 may generate control signals for controlling operations of the unit pixels (PX), and may process pixel signals output from the unit pixels (PX). For example, the logic transistors 214 may include transistors constituting or including the row driver 20, the correlated double sampler (CDS) 30, the ADC 40, the output buffer 50, the column driver 60, and the timing controller 70, which are shown in FIG. 1. The logic transistors 214 may be formed in the logic region (LA) of the second substrate 212.

The second interconnect layer 220 may be formed over the second front surface of the second substrate 212, and may be formed to contact the first interconnect layer 120 of the first stacked structure 100. The second interconnect layer 220 may be formed closer to the second front surface of the second substrate 212 as compared to the second back surface of the second substrate 212. The second interconnect layer 220 may include a second interlayer insulation layer 222, a plurality of second metal lines (224, 225), and a plurality of second bonding pads 226.

The second interlayer insulation layer 222 may include an insulation material formed between any two of the logic transistors 214, the second metal lines (224, 225), and the second bonding pads 226. For example, the second interlayer insulation layer 222 may include an insulation material formed between the second metal lines 225 and 224 or between the second metal lines 224 and the logic transistors 214. The second interlayer insulation layer 222 may include at least one of silicon oxide, silicon nitride, or silicon oxynitride.

The second metal lines (224, 225) may be formed in the second interlayer insulation layer 222, and may electrically connect the logic transistors 214 and the second bonding pads 226 to each other. In some implementations, the second metal lines (224, 225) may electrically interconnect the logic transistors 214 in the logic region LA. The second metal lines (224, 225) may be formed in a multilayer structure. Among the second metal lines (224, 225), the uppermost metal line 225 may include aluminum (Al), and the other metal line 224 may include copper (Cu) but other implementations are also possible.

The second metal lines 225 may be connected to the second bonding pads 226, and the electrode pad (PAD) may be bonded to wire bonding balls by a direct bonding method. Although the electrode pad (PAD) is shown separately from the second metal lines 225 in FIG. 4, other implementations are also possible. For example, the electrode pad (PAD) may be a portion of the second metal lines 225. For example, the electrode pad (PAD) may be disposed at the same layer as the second metal lines 225, and may be formed simultaneously with formation of the second metal lines 225.

The second metal lines 224 and the electrode pad (PAD) may be connected to the third stacked structure 300 through the TSV structure 240. In some implementations, the second metal lines (224, 225) may include metal lines extending in a horizontal direction, and a plurality of vias (not shown) formed to vertically interconnect metal lines located in different layers.

The second bonding pads 226 may electrically connect the first interconnect layer 120 of the first stacked structure 100 to the second metal lines (224, 225). Bottom surfaces of the second bonding pads 226 may be connected to the second metal lines 225, and top surfaces of the second bonding pads 226 may be bonded to bottom surfaces of the first bonding pads 126. Top surfaces of the second bonding pads 226 may be formed at the same level as the top surface of the second interlayer insulation layer 222. The second bonding pads 226 may include copper (Cu).

The bonding insulation layer 230 may be formed below the second back surface of the second substrate 212 to be in contact with the second back surface of the second substrate 212. The bonding insulation layer 230 may be an insulation layer formed by a hybrid bonding between the second stacked structure 200 and the third stacked structure 300, and the bottom surface of the bonding insulation layer 230 may be formed to have the same level as the bottom surfaces of the TSV structures 240. The bonding insulation layer 230 may be formed between the TSV structures 240 protruding from the second back surface of the second substrate 212 so as to insulate between the TSV structures 240.

The TSV structures 240 may penetrate the second substrate 212 and the bonding insulation layer 230 to electrically connect the second interconnect layer 220 of the second stacked structure 200 to the third interconnect layer 320 of the third stacked structure 300. For example, the TSV structures 240 may electrically connect the second metal lines 224 and the electrode pad (PAD) of the second interconnect layer 220 to the third bonding pads 326 of the third interconnect layer 320. Bottom surfaces of the TSV structures 240 may be formed at the same level as the bottom surface of the bonding insulation layer 230. In some implementations, the second stacked structure 200 and the third stacked structure 300 may be bonded to each other by a hybrid bonding method in which the TSV structures 240 and the third bonding pads 326 are directly bonded to each other at a bonding interface and the insulation layers (230, 322) are directly bonded to each other. The TSV structures 240 may include copper (Cu).

The third stacked structure 300 may include a third substrate layer 310 and a third interconnect layer 320.

The third substrate layer 310 may include a third substrate 312 and a plurality of memory transistors 314.

The third substrate 312 may include a third front surface and a third back surface facing or opposite the third front surface. The third front surface of the third substrate 312 may be in contact with the third interconnect layer 320, and the memory transistors 314 may be formed on the third front surface of the third substrate 312. The third substrate 312 may be formed of or include the same material as the second substrate 212.

The memory transistors 314 may be formed over the third front surface of the third substrate 312 to be connected to the third metal lines 324. The memory transistors 314 may constitute or include a memory circuit which receives signals (data) processed by the logic circuit of the second stacked structure 200 and data received through the electrode pad (PAD) through third metal lines 324, and then stores the received data.

The third interconnect layer 320 may be formed over the third front surface of the third substrate 312 to contact the bonding insulation layer 230 of the second stacked structure 200. The third interconnect layer 320 may include a third interlayer insulation layer 322, third metal lines 324, and third bonding pads 326.

The third interlayer insulation layer 322 may include an insulation material formed between any two of the memory transistors 314, the third metal lines 324, and the third bonding pads 326. For example, the insulation material of the third interlayer insulation layer may be disposed between the memory transistors 314 and the third metal lines 324, between the third metal lines 324 and the third bonding pads 326, or between the memory transistors 314 and the third bonding pads 326.

The third metal lines 324 may be formed in the third interlayer insulation layer 322, and may electrically connect the memory transistors 314 and the third bonding pads 326 to each other. Also, the third metal lines 324 may electrically connect the memory transistors 314 to each other. The third metal lines 324 may include copper (Cu), and may be formed in a multilayer structure. In some implementations, the third metal lines 324 may include metal lines extending in a horizontal direction and a plurality of vias (not shown) formed to vertically interconnect metal lines located in different layers.

The third bonding pads 326 may electrically connect the TSV structures 240 of the second stacked structure 200 to the third metal lines 324. Bottom surfaces of the third bonding pads 326 may be connected to the third metal lines 324. Top surfaces of the third bonding pads 326 may be formed to have the same level as the top surface of the third interlayer insulation layer 322, and may be bonded to bottom surfaces of the TSV structures 240. In some implementations, the second stacked structure 200 and the third stacked structure 300 may be bonded to each other by a hybrid bonding method in which the TSV structures 240 and the third bonding pads 326 are directly bonded to each other at a bonding interface and the insulation layers (230, 322) are directly bonded to each other. The third bonding pads 326 may include copper (Cu).

FIGS. 5 to 12 are cross-sectional views illustrating examples of a method for forming the structure shown in FIG. 4 based on some implementations of the disclosed technology.

Figure 5:
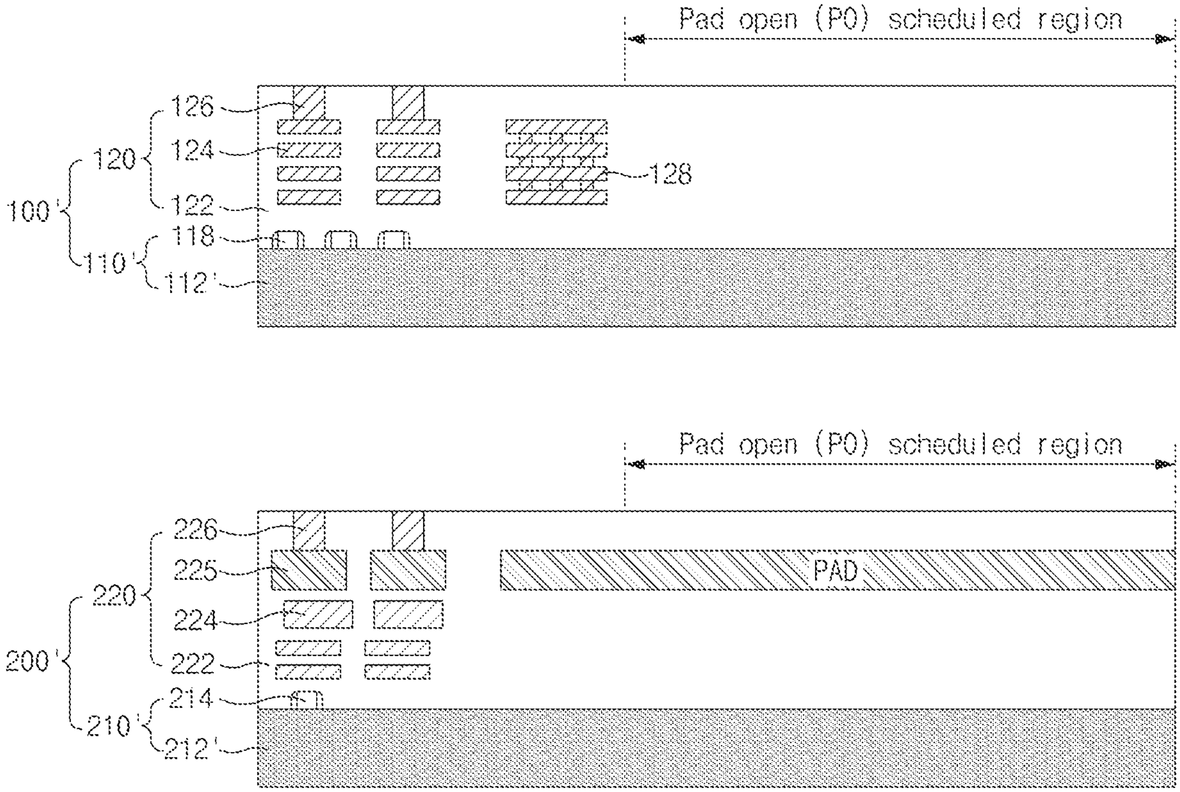
FIGS. 5 to 12 are cross-sectional views illustrating examples of a method for forming the structure shown in FIG. 4 based on some implementations of the disclosed technology.

Referring to FIG. 5, each of the first stacked structure 100' and the second stacked structure 200' may be formed through a separate (or independent) process.

In the first stacked structure 100', pixel transistors 118 may be formed over the first front surface of the first substrate 112', and the first interconnect layer 120 may be formed over the first front surface of the first substrate 112'.

The first interconnect layer 120 may have a structure in which first metal lines 124 are formed in a multilayer structure within the first interlayer insulation layer 122 and first metal lines 124 disposed in different layers are connected to each other through vias. For example, the first interlayer insulation layer 122 may be formed in a structure in which a plurality of insulation layers are sequentially stacked. After each insulation layer is formed, vias formed to penetrate the corresponding insulation layer may be formed, and metal lines may be patterned to be connected to vias on the corresponding insulation layer. The first metal lines 124 may include copper (Cu).

A seal-ring structure 128 in which a barrier structure is formed by connecting the metal lines to the vias may be formed in a region adjacent to a region (hereinafter referred to as a pad open (PO) scheduled region) in which a pad open (PO) region is to be formed in the first interlayer insulation layer 122. The seal-ring structure 128 may be electrically isolated from the first metal lines 124, and may be formed to surround the pad open (PO) scheduled region when viewed in a plan view.

The pixel transistors 118 and the first interconnect layer 120 may be formed in the same manner as in the related art.

After the first metal lines 124 are formed, first bonding pads 126 connected to the uppermost metal line may be formed. Top surfaces of the first bonding pads 126 may be formed to have the same level as the top surface of the first interlayer insulation layer 122. For example, the top surface of the first interconnect layer 120 may be planarized through a planarization process such as a chemical mechanical polishing (CMP) process such that top surfaces of the first bonding pads 126 and the top surface of the first interlayer insulation layer 122 can be disposed at the same level. The first bonding pads 126 may be formed of the same material as the first metal lines 124.

In the second stacked structure 200', logic transistors 214 may be formed over the second front surface of the second substrate 212', and the second interconnect layer 220 may be formed over the second front surface of the second substrate 212'.

In the second interconnect layer 220, the second metal lines (224, 225) may be formed in a multilayer structure within the second interlayer insulation layer 222, and the second metal lines (224, 225) disposed in different layers may be connected to each other through vias. For example, the second interlayer insulation layer 222 may be formed in a structure in which a plurality of insulation layers is sequentially stacked. After each insulation layer is formed, vias formed to penetrate the insulation layer may be formed, and metal lines may be patterned to be connected to vias on the corresponding insulation layer.

In the second metal lines (224, 225), the uppermost metal lines 225 may be formed of a different material from the other metal lines 224 disposed below the uppermost metal lines 225. For example, the metal lines 224 may include copper (Cu), and the uppermost metal lines 225 may include aluminum (Al).

The electrode pad (PAD) may include the same material as the second metal lines 225, and may be disposed at the same layer as the second metal lines 225. For example, the electrode pad (PAD) may be formed in a wide flat plate shape when the second metal lines 225 are formed.

After the second metal lines 225 and the electrode pad (PAD) are formed, the second bonding pads 226 connected to the second metal lines 225 may be formed. Top surfaces of the second bonding pads 226 may be formed to have the same level as the top surface of the second interlayer insulation layer 222.

Figure 6:
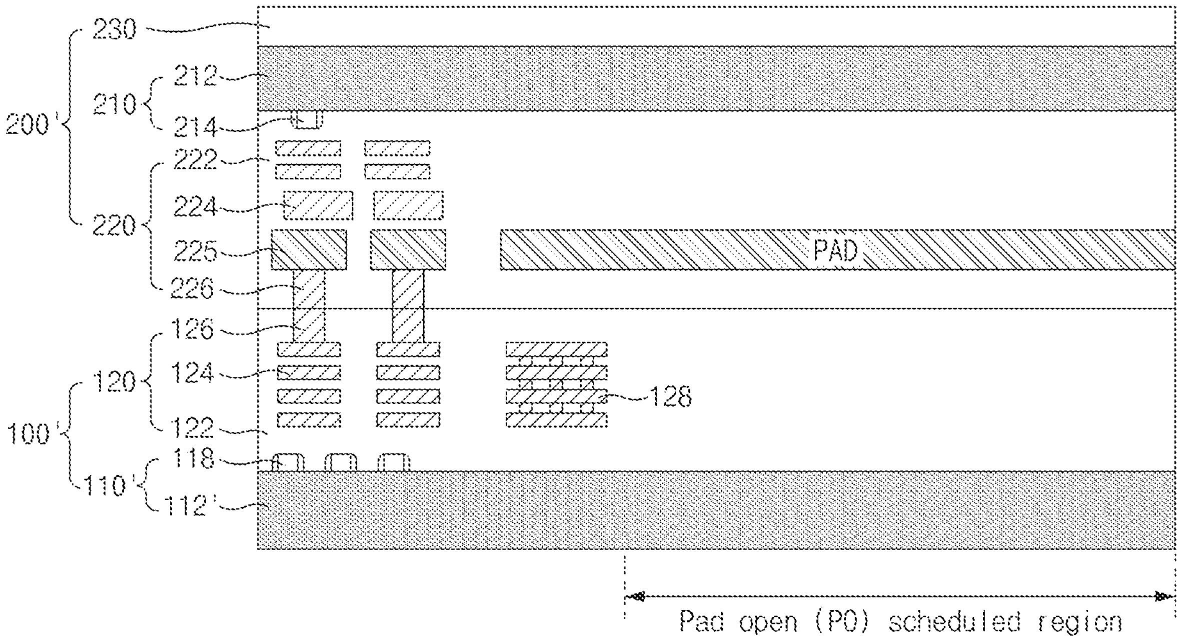

Referring to FIG. 6, the first stack structure 100' and the second stack structure 200' may be bonded to each other using a hybrid bonding method in which the first bonding pads 126 and the second bonding pads 226 are bonded to each other.

Subsequently, the second substrate 212 may be formed by etching the second back surface of the second substrate 212' as a whole to reduce a thickness of the substrate. For example, the thickness of the substrate may be reduced by polishing the second back surface of the second substrate 212' using a wet thinning process. At this time, the thickness of the substrate may be reduced to a predetermined thickness.

Subsequently, a bonding insulation layer 230 may be formed over the second back surface of the second substrate 212.

Figure 7:
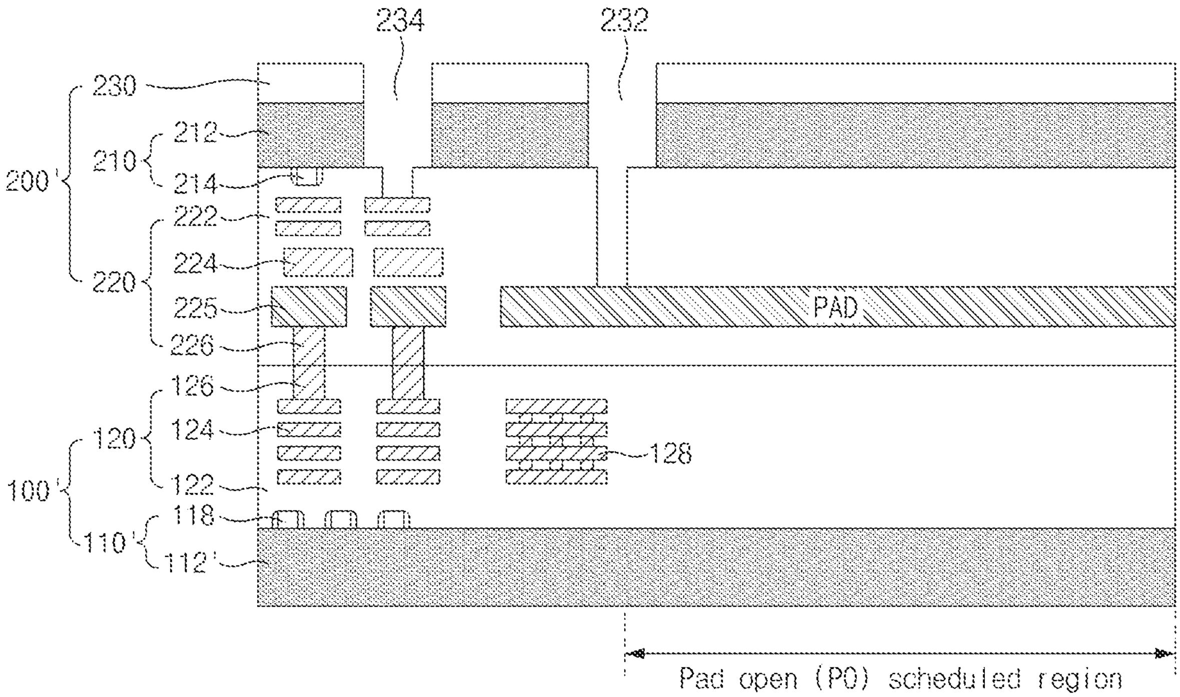

Referring to FIG. 7, through-holes (232, 234) may be formed to expose the electrode pad (PAD) and the second metal lines 224.

For example, in the pad region, the through-hole 232 that penetrates the bonding insulation layer 230 and the second substrate 212 to expose the electrode pad (PAD) may be formed such that a portion of the second interlayer insulation layer 222 is etched. In addition, in a region where the logic circuit is formed, the through-hole 234 that penetrates the bonding insulation layer 230 and the second substrate 212 to expose the uppermost metal line among the second metal lines 224 may be formed such that a portion of the second interlayer insulation layer 222 is etched.

In the through-holes 232 and 234, a first region through which the bonding insulation layer 230 and the second substrate 212 pass and a second region where the second interlayer insulation layer 222 is etched may be formed to have different widths of through-holes in a manner that there occurs a step difference between the first region and the second region. For example, the bonding insulation layer 230 and the second substrate 212 may be sequentially etched to expose the second interlayer insulation layer 222, resulting in formation of first through-holes. Subsequently, the second interlayer insulation layer 222 may be etched to expose the second metal lines 224 and the electrode pad (PAD), resulting in formation of second through-holes, each of which has a smaller width than the first through-hole.

Figure 8:
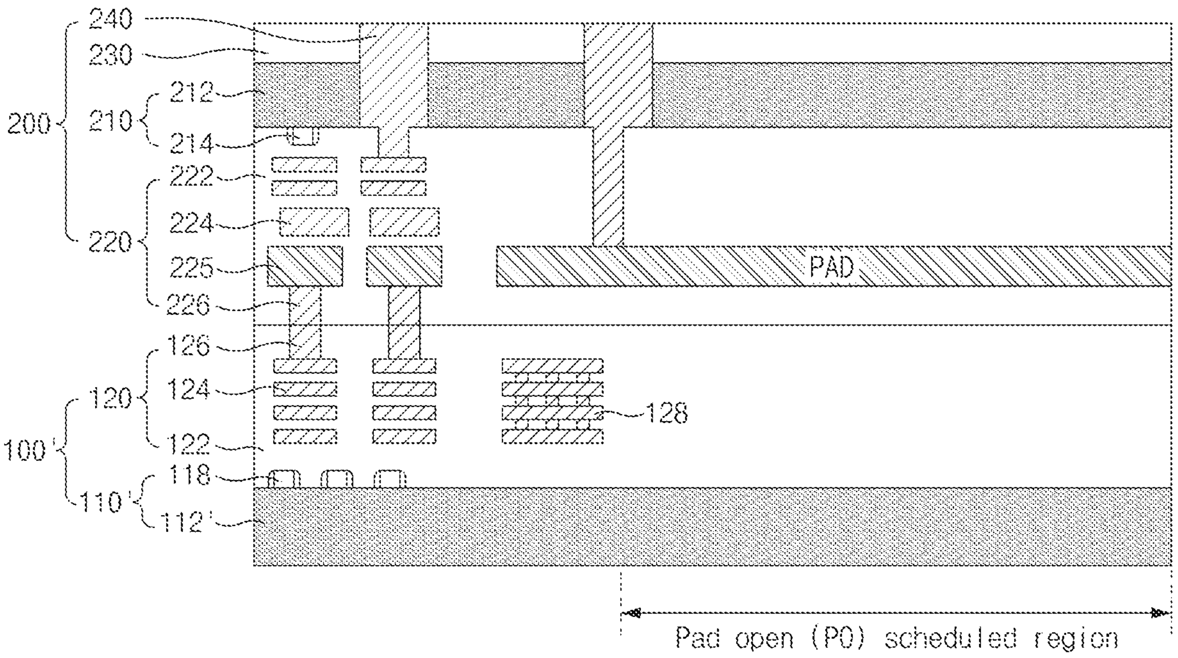

Referring to FIG. 8, a conductive material (e.g., copper) may be formed to fill the through-holes 232 and 234 so that TSV structures 240 connected to either the electrode pad (PAD) or the second metal lines 224 can be formed.

Figure 9:
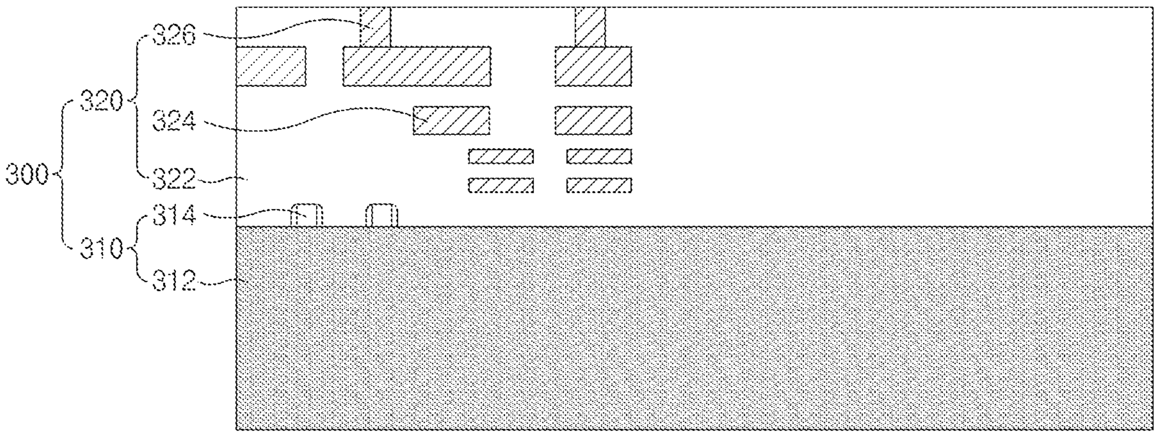

Referring to FIG. 9, the third stacked structure 300 may be formed through a separate process different from those of the first stacked structure 100 and the second stacked structure 200. For example, the memory transistors 314 may be formed over the third front surface of the third substrate 312, and the third interconnect layer 320 may be formed over the third front surface of the third substrate 312, resulting in formation of the third stacked structure 300.

The third interconnect layer 320 may be formed in a structure in which third metal lines 324 are formed in a multilayer structure within the third interlayer insulation layer 322 and third metal lines 324 disposed in different layers are connected to each other through vias. For example, the third interlayer insulation layer 322 may be formed in a structure in which a plurality of insulation layers is sequentially stacked. After each insulation layer is formed, vias formed to penetrate the corresponding insulation layer are formed, and metal lines may be patterned to be connected to vias on the insulation layer. The third metal lines 324 may include copper (Cu).

After the third metal lines 324 are formed, the third bonding pads 326 connected to the uppermost metal line may be formed. Top surfaces of the third bonding pads 326 may be formed to have the same level as the top surface of the third interlayer insulation layer 322.

In some implementations, although the above-described embodiment has disclosed that the third stacked structure 300 is formed after formation of the first stacked structure 100' and the second stacked structure 200 for convenience of description, the order of forming the first to third stacked structures 100', 200 and 300 does not matter because each of the first to third stacked structures 100', 200 and 300 is formed through a separate (or independent) process.

Figure 10:
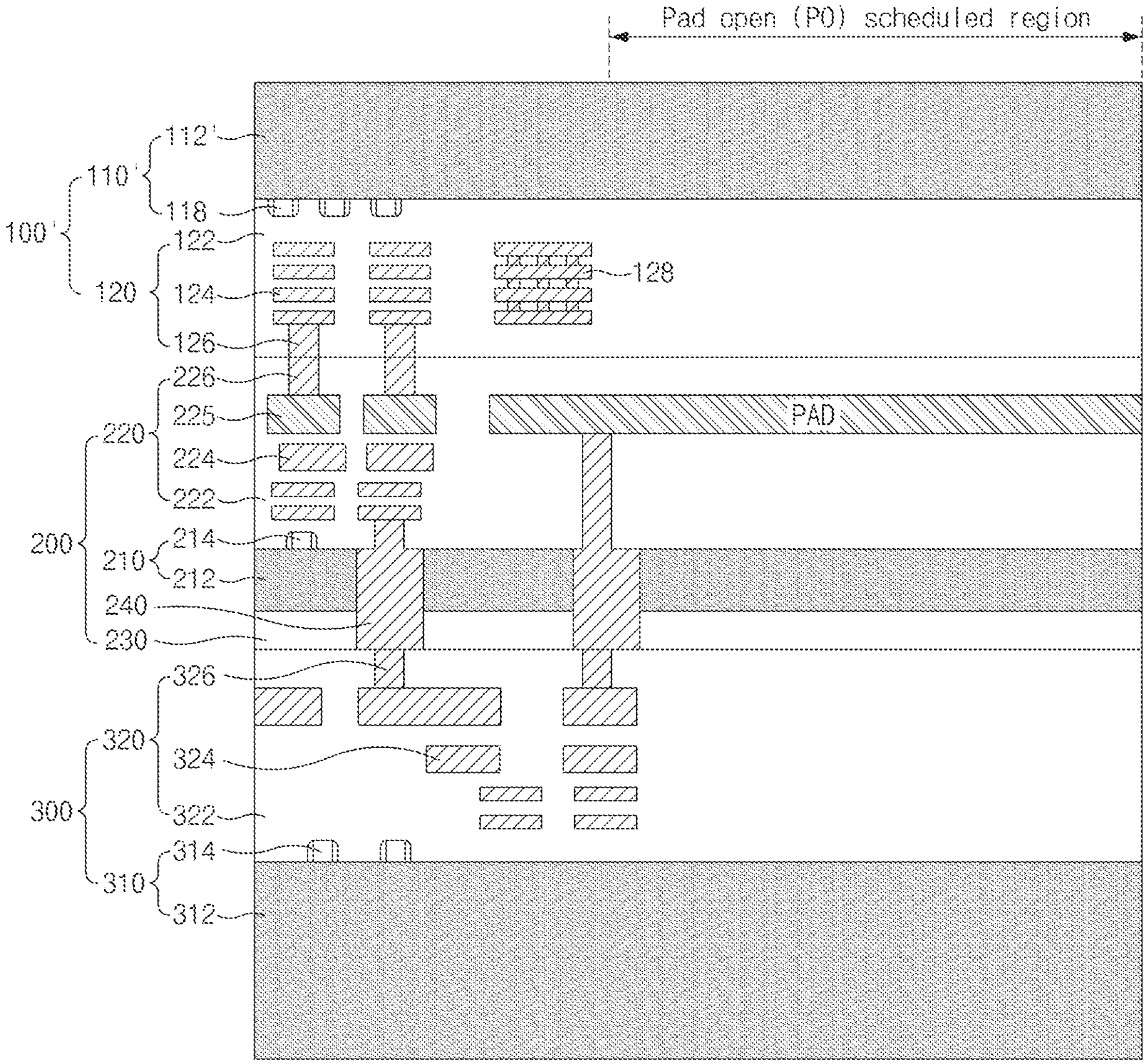

Referring to FIG. 10, the third stacked structure 300 may be bonded to the second stacked structure 200 using a hybrid bonding method in which the third bonding pads 326 and the TSV structures 240 are bonded to each other.

Figure 11:
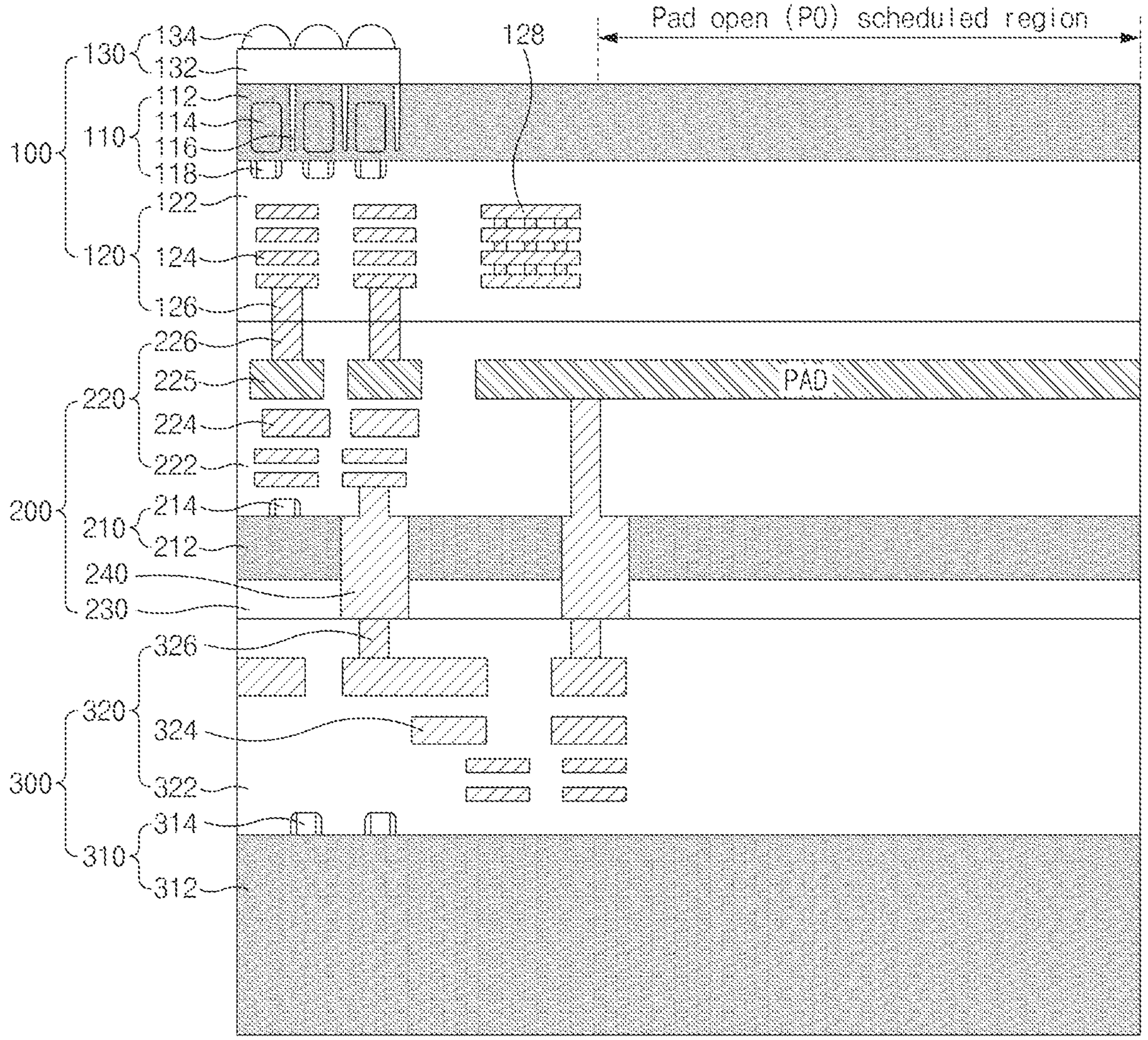

Referring to FIG. 11, the first substrate 112 may be formed by etching the first back surface of the first substrate 112' as a whole to reduce a thickness of the substrate. For example, the thickness of the substrate may be reduced by polishing the first back surface of the first substrate 112' using a wet thinning process. At this time, the thickness of the substrate may be reduced to a predetermined thickness.

Subsequently, the photoelectric conversion elements 114 and the pixel isolation structures 116 may be formed in the first substrate 112.

Then, a light reception layer 130 may be formed over the first back surface of the first substrate 112. For example, a color filters 132 may be formed over the first back surface of the first substrate 112, and microlenses 134 may be formed over the color filters 132.

Figure 12:
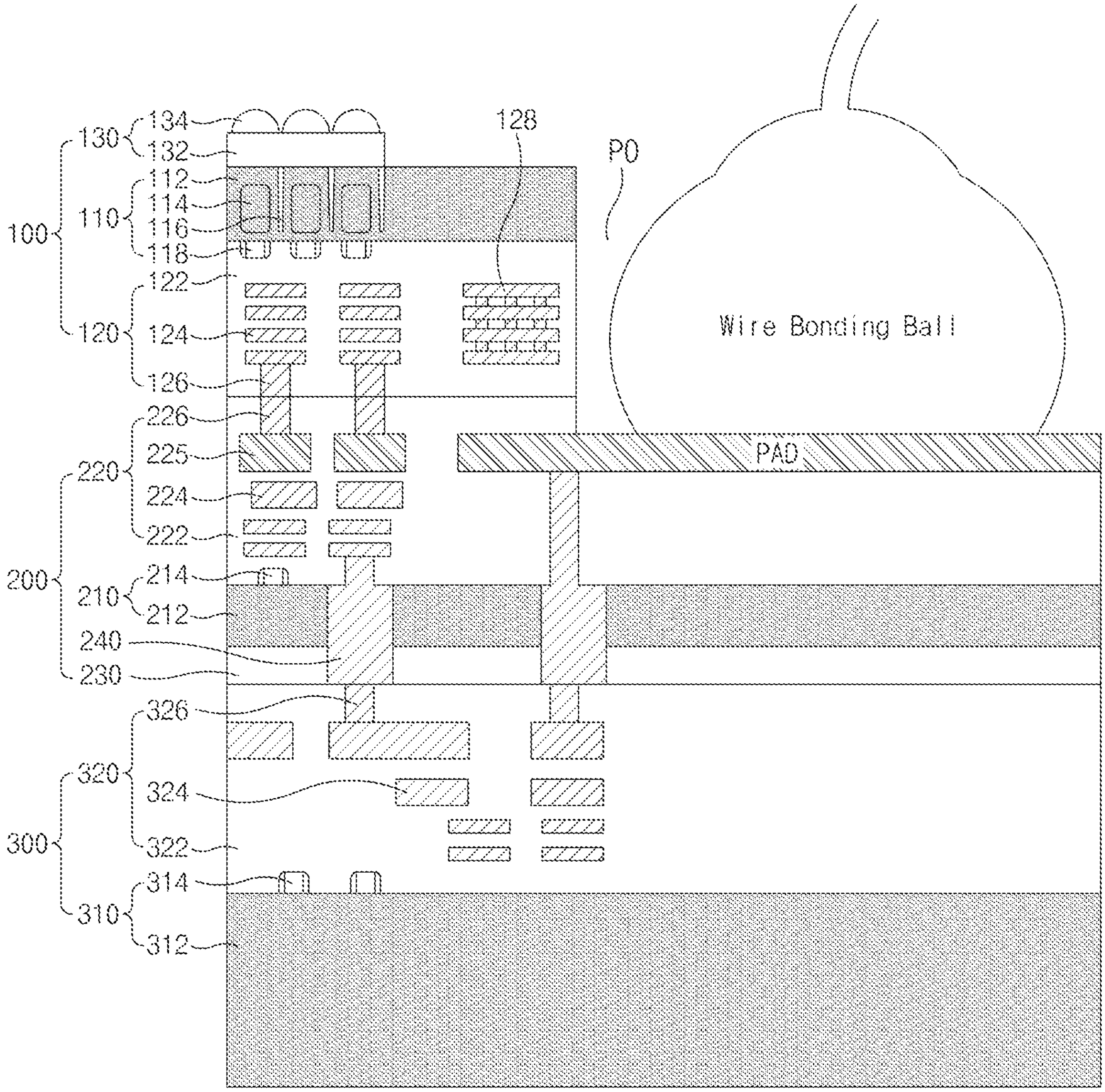

Referring to FIG. 12, the first substrate 112, the first interlayer insulation layer 122, and the second interlayer insulation layer 222 of the pad open (PO) scheduled region may be etched to expose the electrode pad (PAD), resulting in formation of a pad open (PO) region.

Thereafter, a wire bonding ball may be formed over the electrode pad (PAD) so as to be directly bonded to the electrode pad (PAD) through a wire bonding process.

Although the above-described embodiment has disclosed an example case in which the stacked structure is used in the image sensing device for convenience of description, other implementations are also possible, and implementations of the disclosed technology can also be easily applied to various semiconductor devices configured to have various functions.

For example, cell arrays of memory devices may be formed in the first substrate 112 of the first stacked structure 100, and circuit elements for storing data in the cell arrays or reading out data stored in the cell arrays may be formed in the second substrate 212 of the second stacked structure 200. In addition, application circuits configured to provide various services using data stored in the cell arrays may be formed in the third substrate 312 of the third stacked structure 300.

As is apparent from the above description, the semiconductor device based on some implementations of the disclosed technology can reduce the chip size while performing various functions by stacking substrate layers designed to perform different functions.

The embodiments of the disclosed technology may provide a variety of effects capable of being directly or indirectly recognized through the above-mentioned patent document.

Although a number of illustrative embodiments have been described, it should be understood that various modifications or enhancements of the disclosed embodiments and other embodiments can be devised based on what is described and/or illustrated in this patent document.

What is claimed is:

1. A method for manufacturing a semiconductor device comprising:

forming a first stacked structure in which a first interconnect layer having a first bonding pad is formed over a first front surface of a first substrate, a second stacked structure in which a second interconnect layer having a second bonding pad and an electrode pad is formed over a second front surface of a second substrate, and a third stacked structure in which a third interconnect layer having a third bonding pad is formed over a third front surface of a third substrate;

disposing the first stacked structure over the second stacked structure such that the first bonding pad and the second bonding pad are directly bonded to each other;

forming an interconnection via structure that penetrates the second substrate and contacts the electrode pad by etching the second substrate and the second interconnect layer;

disposing the third stacked structure over the second stacked structure such that the interconnection via structure and the third bonding pad are directly bonded to each other; and forming a pad open region exposing the electrode pad by etching the first substrate, the first interconnect layer, and the second interconnect layer.

2. The method according to claim 1, wherein the forming of the interconnection via structure includes:

forming a first through-hole having a first width by etching the second substrate;

forming a second through-hole having a second width smaller than the first width by etching the second interconnect layer to expose the electrode pad; and forming a conductive material to fill the first through-hole and the second through-hole.

3. The method according to claim 1, further comprising:

after disposing the first stacked structure over the second stacked structure and prior to the forming of the interconnection via structure, etching the second substrate to reduce a thickness of the second substrate to a predetermined thickness.

4. The method according to claim 3, further comprising:

after the etching of the second substrate, forming a bonding insulation layer over a back surface of the second substrate that is located opposite to a top surface of the second substrate on which the second interconnect layer is formed.

5. The method according to claim 4, wherein the forming the interconnection via structure includes:

forming a first through-hole having a first width by sequentially etching the bonding insulation layer and the second substrate;

forming a second through-hole having a second width smaller than the first width by etching the second interconnect layer to expose the electrode pad; and forming a conductive material to fill the first through-hole and the second through-hole.

6. The method according to claim 1, further comprising:

after the disposing of the third stacked structure on the second stacked structure, etching the first substrate to reduce a thickness of the first substrate to a predetermined thickness;

forming photoelectric conversion elements and a pixel isolation structure that isolates the photoelectric conversion elements from each other in the first substrate; and forming color filters and microlenses over the first substrate.

* * * * *